(12) United States Patent
Sasaki

(10) Patent No.: US 11,031,541 B2
(45) Date of Patent: Jun. 8, 2021

(54) SPIN-ORBIT TORQUE TYPE MAGNETIZATION ROTATING ELEMENT, SPIN-ORBIT TORQUE TYPE MAGNETORESISTANCE EFFECT ELEMENT, AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 156 days.

(21) Appl. No.: 16/338,653

(22) PCT Filed: Oct. 10, 2018

(86) PCT No.: PCT/JP2018/037721
§ 371 (c)(1),
(2) Date: Apr. 1, 2019

(87) PCT Pub. No.: WO2019/159428
PCT Pub. Date: Aug. 22, 2019

(65) Prior Publication Data
US 2020/0395533 A1    Dec. 17, 2020

(30) Foreign Application Priority Data
Feb. 19, 2018 (JP) .............................. JP2018-027130

(51) Int. Cl.
*H01L 43/04* (2006.01)
*H01L 43/02* (2006.01)
(Continued)

(52) U.S. Cl.
CPC ........... *H01L 43/02* (2013.01); *H01F 10/329* (2013.01); *H01F 10/3254* (2013.01);
(Continued)

(58) Field of Classification Search
CPC .............................. H01L 43/04; G11C 11/161
(Continued)

(56) References Cited

U.S. PATENT DOCUMENTS

| 8,350,347 B2 | 1/2013 | Gaudin et al. |
| 9,691,458 B2 * | 6/2017 | Ralph ................. H01F 10/3263 |

(Continued)

FOREIGN PATENT DOCUMENTS

| CN | 108011037 A | 5/2018 |
| JP | 2004-220692 A | 8/2004 |

(Continued)

OTHER PUBLICATIONS

S. Fukami et al, "A spin-orbit torque switching scheme with collinear magnetic easy axis and current configuration," Nature Nanotechnology, Mar. 21, 2016, pp. 1-6.

(Continued)

*Primary Examiner* — Jami Valentine Miller
(74) *Attorney, Agent, or Firm* — Oliff PLC

(57) ABSTRACT

A spin-orbit torque wiring extending in a first direction and a first ferromagnetic layer laminated on one surface of the spin-orbit torque wiring. In addition, the spin-orbit torque wiring includes a first wiring and a second wiring from the first ferromagnetic layer side. The first wiring and the second wiring are both made of a metal and a temperature dependency of the resistivity of the first wiring in a temperature range of at least −40° C. to 100° C. is higher than that of the second wiring.

18 Claims, 5 Drawing Sheets

(51) Int. Cl.
*H01F 10/32* (2006.01)
*H01L 27/22* (2006.01)
*H01L 43/06* (2006.01)
*G11C 11/16* (2006.01)
*H01L 43/10* (2006.01)

(52) U.S. Cl.
CPC ............ *H01L 27/228* (2013.01); *H01L 43/04* (2013.01); *H01L 43/065* (2013.01); *G11C 11/161* (2013.01); *G11C 11/1659* (2013.01); *G11C 11/1673* (2013.01); *G11C 11/1675* (2013.01); *H01L 27/222* (2013.01); *H01L 43/10* (2013.01)

(58) Field of Classification Search
USPC .......................................................... 257/427
See application file for complete search history.

(56) References Cited

U.S. PATENT DOCUMENTS

| | | |
|---|---|---|
| 2004/0136120 A1 | 7/2004 | Hayakawa et al. |
| 2009/0161265 A1 | 6/2009 | Sugano et al. |
| 2014/0056060 A1 | 2/2014 | Khvalkovskiy et al. |
| 2014/0198564 A1* | 7/2014 | Guo .................... G11C 11/1673 365/158 |
| 2015/0036415 A1 | 2/2015 | Di Pendina et al. |
| 2015/0348606 A1 | 12/2015 | Buhrman et al. |
| 2016/0169988 A1 | 6/2016 | Sirringhaus et al. |
| 2017/0076769 A1 | 3/2017 | Shirotori et al. |
| 2017/0076770 A1 | 3/2017 | Daibou et al. |
| 2017/0222135 A1 | 8/2017 | Fukami et al. |
| 2018/0033953 A1 | 2/2018 | Sasaki et al. |
| 2018/0123021 A1 | 5/2018 | Sasaki et al. |
| 2018/0254773 A1* | 9/2018 | Yoshinari ............ H01F 10/3286 |
| 2018/0337326 A1 | 11/2018 | Sasaki |
| 2018/0350417 A1 | 12/2018 | Shiokawa et al. |
| 2018/0351082 A1 | 12/2018 | Sasaki et al. |
| 2018/0351083 A1 | 12/2018 | Sasaki |
| 2018/0351084 A1 | 12/2018 | Sasaki |
| 2018/0351085 A1 | 12/2018 | Shiokawa et al. |
| 2019/0035446 A1 | 1/2019 | Shibata et al. |
| 2019/0051815 A1* | 2/2019 | Kakinuma .............. H01L 43/06 |

FOREIGN PATENT DOCUMENTS

| | | |
|---|---|---|
| JP | 2008/076289 A | 4/2008 |
| JP | 2009/158554 A | 7/2009 |
| JP | 2014/045196 A | 3/2014 |
| JP | 2014-086448 A | 5/2014 |
| JP | 2017/059594 A | 3/2017 |
| JP | 2017-059634 A | 3/2017 |
| JP | 2018/026525 A | 2/2018 |
| WO | 2016/021468 A1 | 2/2016 |
| WO | 2016/159017 A1 | 10/2016 |
| WO | 2017/090726 A1 | 6/2017 |
| WO | 2017/213261 A1 | 12/2017 |

OTHER PUBLICATIONS

Kato et al, "Observation of the Spin Hall Effect in Semiconductors," Science Magazine, vol. 306, Dec. 10, 2004, pp. 1910-1913.
Ioan Mihai Miron et al, "Perpendicular switching of a single ferromagnetic layer induced by in-plane current injection," Nature Magazine, vol. 476, Aug. 11, 2011, pp. 189-194.
Luqiao Liu et al, "Spin torque switching with the giant spin Hall effect of tantalum," Science, 336, 555, Jul. 21, 2017.
Luqiao Liu et al, "Current-Induced Switching of Perpendicularly Magnetized Magnetic Layers Using Spin Torque from the Spin Hall Effect," Physical Review Letters, American Physical Society, Aug. 31, 2012, pp. 096602-1-096602-5.
Ki-Seung Lee et al, "Threshold current for switching of a perpendicular magnetic layer induced by spin Hall effect," Applied Physics Letter, Oct. 11, 2012, 5 pgs.
Ki-Seung Lee et al, "Thermally activated switching of perpendicular magnet by spin-orbit spin torque," Applied Physics Letter 104, Jan. 7, 2014, 6 pgs.
Shunsuke Fukami et al, "Magnetization switching by spin-orbit torque in an antiferromagnet-ferromagnet bilayer system," Nature Materials, published Feb. 15, 2016, vol. 15, pp. 535-542.
S. Takahashi et al, "Spin injection and detection in magnetic nanostructures," Physical Review B 67, 052409, Feb. 28, 2003, 4 pgs.
Yeongkyo Seo et al, "Area-Efficient SOT-MRAM With a Schottky Diode," IEEE Electron Device Letters, vol. 37, No. 8, pp. 982-985.
Wei Zhang et al, "Spin Hall Effects in Metallic Antiferromagnets," Physical Review Letters 113, Nov. 7, 2014, 6 pgs.
Dec. 18, 2018 Written Opinion of the International Searching Authority issued in PCT Application No. PCT/JP2018/037721.
Apr. 16, 2019 International Search Report cited in PCT Application No. PCT/JP2019/004840.
U.S. Appl. No. 16/756,262, filed Apr. 15, 2020.

\* cited by examiner

SPIN-ORBIT TORQUE TYPE MAGNETIZATION ROTATING ELEMENT, SPIN-ORBIT TORQUE TYPE MAGNETORESISTANCE EFFECT ELEMENT, AND MAGNETIC MEMORY

TECHNICAL FIELD

The present disclosure relates to a spin-orbit torque type magnetization rotating element, a spin-orbit torque type magnetoresistance effect element, and a magnetic memory.

Priority is claimed on Japanese Patent Application No. 2018-027130, filed Feb. 19, 2018, the content of which is incorporated herein by reference.

BACKGROUND ART

Giant magnetoresistance (GMR) elements formed of a multilayer film constituted of a ferromagnetic layer and a non-magnetic layer and tunneling magnetoresistance (TMR) elements using an insulating layer (a tunnel barrier layer or a barrier layer) for a non-magnetic layer are known as magnetoresistance effect elements. Generally, TMR elements have a higher element resistance and a higher magnetoresistance (MR) ratio than GMR elements. For this reason, TMR elements are attracting attention as magnetic sensors, high frequency components, magnetic heads, and elements for nonvolatile random access memories (MRAMs).

In recent years, attention has been attracted to magnetization rotation using a pure spin current generated by spin-orbit interaction (for example, Non-Patent Literature 1). An SOT is induced by a pure spin current caused by spin-orbit interaction or the Rashba effect at an interface between different materials. A current for inducing an SOT in a magnetoresistance effect element flows in a direction intersecting a lamination direction of the magnetoresistance effect element. That is to say, it is not necessary for a current to flow in the lamination direction of the magnetoresistance effect element and a longer life for the magnetoresistance effect element can be expected.

CITATION LIST

Patent Literature

[Non-Patent Literature 1]
S. Fukami, T. Anekawa, C. Zhang, and H. Ohno, Nature Nano Tec (2016). DOI:10.1038/NNANO.2016.29.

SUMMARY OF INVENTION

Technical Problem

Elements using a magnetoresistance effect are used for various purposes and an operation in a wide temperature range needs to be secured. In the spin-orbit torque type magnetization rotating element using an SOT, characteristics such as the magnitude of the magnetic anisotropy energy of a ferromagnetic material and the resistivity of a wiring change in accordance with temperature. For this reason, a spin-orbit torque type magnetization rotating element which stably operates is required even when an operating temperature range varies.

The present disclosure was made in view of the above-described circumstances, and an objective of the present disclosure is to provide a spin-orbit torque type magnetization rotating element, a spin-orbit torque type magnetoresistance effect element, and a magnetic memory having a low temperature dependency.

Solution to Problem

As a result of intensive research, the inventors of the present disclosure have found that, by making a spin-orbit torque wiring have a lamination structure including a first wiring and a second wiring and it is possible to reduce the temperature dependency of a spin-orbit torque type magnetization rotating element by changing a distribution ratio of a current flowing through the first wiring and the second wiring for respective temperature ranges.

In order to accomplish the objective, the present disclosure provides the following means.

(1) A spin-orbit torque type magnetization rotating element according to a first aspect includes: a spin-orbit torque wiring extending in a first direction; and a first ferromagnetic layer laminated on one surface of the spin-orbit torque wiring, wherein the spin-orbit torque wiring includes a first wiring and a second wiring from the first ferromagnetic layer side, and the first wiring and the second wiring are both made of a metal and a temperature dependency of the resistivity of the first wiring in a temperature range of at least −40° C. to 100° C. is higher than that of the second wiring.

(2) A spin-orbit torque type magnetization rotating element according to a second aspect includes: a spin-orbit torque wiring extending in a first direction; and a first ferromagnetic layer laminated on one surface of the spin-orbit torque wiring, wherein the spin-orbit torque wiring includes a first wiring and a second wiring from the first ferromagnetic layer side and the first wiring is made of a metal and the second wiring is made of a semiconductor.

(3) A spin-orbit torque type magnetization rotating element according to a third aspect includes: a spin-orbit torque wiring extending in a first direction; and a first ferromagnetic layer laminated on one layer of the spin-orbit torque wiring, wherein the spin-orbit torque wiring includes a first wiring and a second wiring from the first ferromagnetic layer side and the first wiring is made of a metal and the second wiring is made of a topological insulator.

(4) A spin-orbit torque type magnetization rotating element according to a fourth aspect includes: a spin-orbit torque wiring extending in a first direction; and a first ferromagnetic layer laminated on one surface of the spin-orbit torque wiring, wherein the spin-orbit torque wiring includes a first wiring and a second wiring from the first ferromagnetic layer side and the first wiring is made of a semiconductor and the second wiring is made of a topological insulator.

(5) In the spin-orbit torque type magnetization rotating element according to the aspect, the second wiring may include at least one alloy selected from the group consisting of chromel, constantan, nichrome, platinum rhodium, manganin, and alumel.

(6) In the spin-orbit torque type magnetization rotating element according to the aspect, the first wiring may include at least one element selected from the group consisting of tungsten, bismuth, rubidium, tantalum, molybdenum, rhodium, and tin and the second wiring may include at least one element selected from the group consisting of iridium, platinum, and palladium.

(7) In the spin-orbit torque type magnetization rotating element according to the aspect, the first wiring may include a non-magnetic metal having a large atomic number with an atomic number of 39 or more having d electrons or f electrons in the outermost shell.

(8) In the spin-orbit torque type magnetization rotating element according to the aspect, a thickness of the first wiring may be equal to or less than a spin diffusion length of an element constituting the first wiring.

(9) A spin-orbit torque type magnetoresistance effect element according to a fifth aspect includes: the spin-orbit torque type magnetization rotating element according to the aspect; a second ferromagnetic layer opposite to the first ferromagnetic layer; and a non-magnetic layer located between the first ferromagnetic layer and the second ferromagnetic layer.

(10) A magnetic memory according to a sixth aspect includes: a plurality of the spin-orbit torque type magnetoresistance effect elements according to the aspect.

Advantageous Effects of Invention

According to a spin-orbit torque type magnetization rotating element associated with the aspect, the temperature dependency can be reduced.

DESCRIPTION OF EMBODIMENTS

Figure 1:
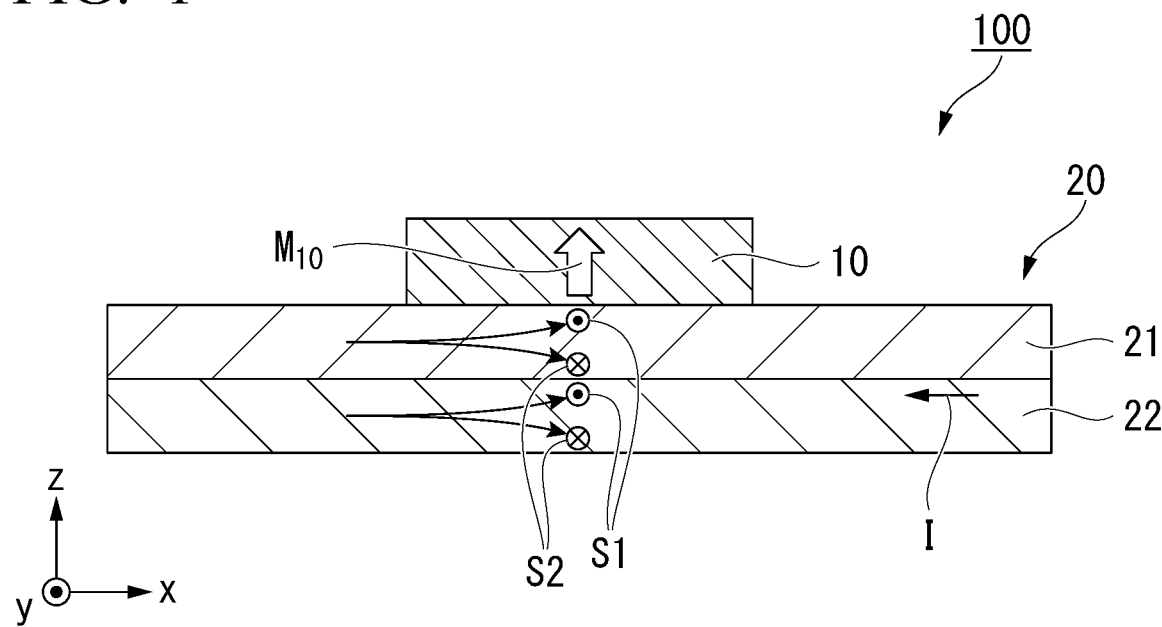
FIG. 1 is a schematic cross-sectional view of a spin-orbit torque type magnetization rotating element according to a first embodiment.

An embodiment will be described in detail below with reference to the drawings as appropriate. In the drawings used in the following description, in order to facilitate understanding of the features of the embodiment, for the sake of convenience, enlarged characteristic portions are illustrated in some cases and dimensional ratios between the constituent elements and the like may be different from the actual dimensional ratios in some cases. The materials, dimensions, and the like exemplified in the following description are mere examples and the embodiment is not limited thereto and the embodiment can be implemented through appropriate modifications without departing from the gist of the present disclosure.

First Embodiment (Spin-Orbit Torque Type Magnetization Rotating Element)

FIG. 1 is a cross-sectional view schematically illustrating a spin-orbit torque type magnetization rotating element according to a first embodiment. A spin-orbit torque type magnetization rotating element 100 illustrated in FIG. 1 includes a first ferromagnetic layer 10 and a spin-orbit torque wiring 20.

Description will be provided below in a state in which a first direction in which the spin-orbit torque wiring 20 extends is defined as an x direction, a direction orthogonal to the first direction in a plane in which the spin-orbit torque wiring 20 is present is defined as a y direction, and a direction orthogonal to both the x direction and the y direction is defined as a z direction. In FIG. 1, the z direction coincides with a lamination direction of the first ferromagnetic layer 10 and a thickness direction of the spin-orbit torque wiring 20.

<First Ferromagnetic Layer>

The first ferromagnetic layer 10 functions when the orientation of its magnetization $M_{10}$ changes. An easy axis of the magnetization of the first ferromagnetic layer 10 illustrated in FIG. 1 is the z direction and the first ferromagnetic layer 10 is a perpendicular magnetization film in which the magnetization $M_{10}$ is oriented in the z direction. The first ferromagnetic layer 10 may be an in-plane magnetization film in which the magnetization $M_{10}$ is oriented an in-plane direction of an xy plane.

A ferromagnetic material, particularly, a soft magnetic material can be applied to the first ferromagnetic layer 10. For example, a metal selected from the group consisting of Cr, Mn, Co, Fe, and Ni, an alloy containing at least one of these metals, an alloy containing at least one of these metals and at least one of B, C, and N, and the like can be used. To be specific, Co—Fe, Co—Fe—B, and Ni—Fe can be exemplified.

Also, a Heusler alloy such as $Co_2FeSi$ may be used for the first ferromagnetic layer 10. A Heusler alloy contains an intermetallic compound having a chemical composition represented by XYZ or $X_2YZ$. Here, X is a transition metal element or a noble metal element from the Co, Fe, Ni, or Cu groups in the periodic table, Y is a transition metal from the Mn, V, Cr, or Ti groups or an element of the X type, and Z is a typical element from Group III to Group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like may be exemplified. The Heusler alloy has high spin polarizability.

<Spin-Orbit Torque Wiring>

The spin-orbit torque wiring 20 extends in the x direction. The spin-orbit torque wiring 20 includes a first wiring 21 and a second wiring 22.

The spin-orbit torque wiring 20 generates a spin current using a spin Hall effect when a current flows. A spin Hall effect is a phenomenon in which a spin current is induced in a direction orthogonal to a direction of a current on the basis of the spin-orbit interaction when the current flows through a wiring. A mechanism by which a spin current is generated using a spin Hall effect will be described.

As illustrated in FIG. 1, when a potential difference is applied to both ends of the spin-orbit torque wiring 20 in the x direction, a current I flows in the x direction. When the current I flows, a first spin S1 oriented in the y direction and a second spin S2 oriented in a −y direction are each bent in a direction orthogonal to that of the current. Although a normal Hall effect and a spin Hall effect are the same in that moving (traveling) electric charges (electrons) are bent in a moving (traveling) direction, the normal Hall effect and the spin Hall effect significantly differ in that, in the normal Hall effect, charged particles moving in a magnetic field are subjected to a Lorentz force and thus the moving direction thereof is bent, whereas in the spin Hall effect, the traveling direction is bent only by the movement of electrons (only the flowing of a current) even through there is no magnetic field.

Since the number of electrons of the first spin S1 is equal to the number of electrons of the second spin S2 in a non-magnetic material (a material which is not a ferromagnetic material), in the drawings, the number of electrons of the first spin S1 going upward is equal to the number of electrons of the second spin S2 going downward. For this reason, a current as a net flow of electric charges is zero. A spin current which does not involve such a current is particularly referred to as a pure spin current.

Here, when a flow of electrons of the first spin S1 is represented by $J\uparrow$, a flow of electrons of the second spin S2 is represented by $J\downarrow$, and a spin current is represented by $J_S$, they are defined by $J_S = J\uparrow - J\downarrow$. In FIG. 1, $J_S$ as the pure spin current flows in the z direction in FIG. 1. Here, $J_S$ is a flow of electrons with the polarization of 100%. When the first ferromagnetic layer 10 is brought into contact with an upper surface of the spin-orbit torque wiring 20, the pure spin current diffuses and flows into the first ferromagnetic layer 10. That is to say, spins are injected into the first ferromagnetic layer 10.

The spin-orbit torque wiring 20 includes at least the first wiring 21 and the second wiring 22. The spin-orbit torque wiring 20 may include three or more wirings laminated thereon.

The first wiring 21 is a wiring in the spin-orbit torque wiring 20 closest to the first ferromagnetic layer 10 side and the second wiring 22 is a wiring on a side at a position farther from the first ferromagnetic layer 10 than the first wiring 21.

Both of the first wiring 21 and the second wiring 22 according to the first embodiment are made of a metal. Here, the term "a metal" is not limited to a single meal and may be an alloy. Furthermore, the expression "made of a metal" allows the metal to include other substances such as impurities as long as the first wiring 21 and the second wiring 22 show a metallic behavior with respect to temperature change. This metallic behavior refers to a behavior in which a resistance value increases along with an increase in temperature.

In the first wiring 21, the temperature dependency of the resistivity in at least a temperature range of −40° C. to 100° C. is larger than that of the second wiring 22. Here, "the temperature dependency of the resistivity" corresponds to a difference between a resistance value of a wiring at −40° C. and a resistance value of the wiring at 100° C. That is to say, a difference between a resistance value of the first wiring 21 at −40° C. and a resistance value thereof at 100° C. is larger than a difference between a resistance value of the second wiring 22 at −40° C. and a resistance value thereof at 100° C.

Figure 2A:
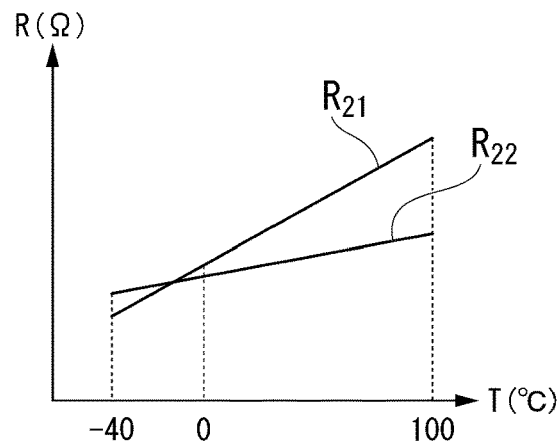
FIG. 2A is a diagram schematically illustrating an example of the temperature dependency of the resistivity of a first wiring and a second wiring in the spin-orbit torque type magnetization rotating element according to the first embodiment.
Figure 2B:
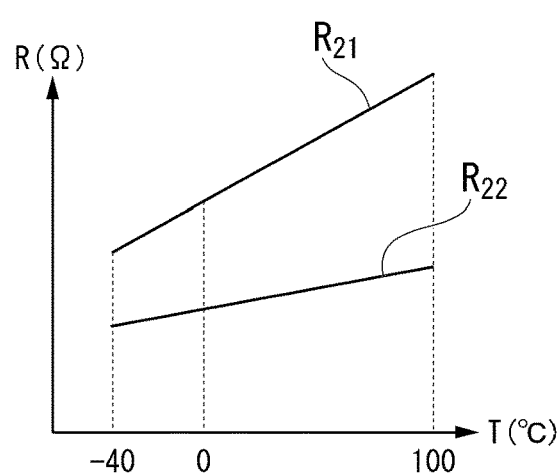
FIG. 2B is a diagram schematically illustrating an example of the temperature dependency of the resistivity of the first wiring and the second wiring in the spin-orbit torque type magnetization rotating element according to the first embodiment.
Figure 2C:
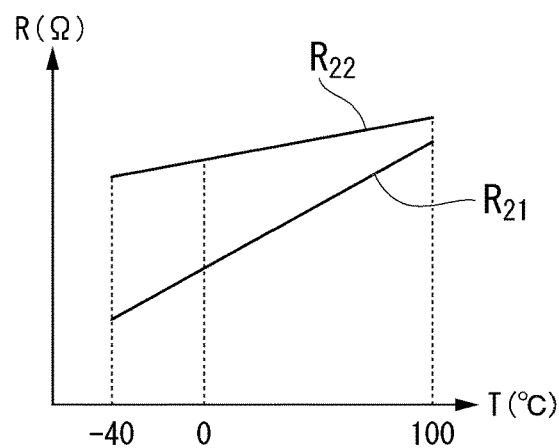
FIG. 2C is a diagram schematically illustrating an example of the temperature dependency of the resistivity of the first wiring and the second wiring in the spin-orbit torque type magnetization rotating element according to the first embodiment.

FIGS. 2A to 2C are diagrams schematically illustrating the temperature dependency of the resistivity of the first wiring 21 and the second wiring 22. A resistance value $R_{21}$ of the first wiring 21 and a resistance value $R_{22}$ of the second wiring 22 may have any of the relationships in FIGS. 2A to 2C therebetween as long as a relationship of the above temperature dependency is satisfied. FIG. 2A is a diagram in a case in which the resistance value $R_{21}$ of the first wiring 21 and the resistance value $R_{22}$ of the second wiring 22 change order at an intersecting point temperature. FIG. 2B is a diagram in a case in which the resistance value $R_{21}$ of the first wiring 21 is larger than the resistance value $R_{22}$ of the second wiring 22 within the temperature range of −40 to 100° C. FIG. 2C is a diagram in a case in which the resistance value $R_{21}$ of the first wiring 21 is smaller than the resistance value $R_{22}$ of the second wiring 22 within the temperature range of −40 to 100° C.

It is desirable that a main constituent element of the first wiring 21 be a non-magnetic heavy metal. Here, the heavy metal refers to a metal having a specific gravity equal to or higher than that of yttrium. It is desirable that the non-magnetic heavy metal be a non-magnetic metal having a large atomic number with an atomic number of 39 or more having d electrons or f electrons in the outermost shell. These non-magnetic metals have a large spin-orbit interaction which causes a spin Hall effect.

Electrons generally move in a direction opposite to that of a current regardless of their spin orientation. On the other hand, a non-magnetic metal having a large atomic number with d electrons or f electrons in the outermost shell has a large spin-orbit interaction and a spin Hall effect strongly acts therewith. For this reason, a direction in which electrons move depends on a direction of spins of the electrons. Therefore, in these non-magnetic heavy metals, a spin current $J_S$ is likely to occur.

The second wiring 22 preferably contains at least one alloy selected from the group consisting of chromel, constantan, nichrome, platinum rhodium, manganin, and alumel. These alloys have low temperature dependency and have little change in resistance value along with temperature change.

Also, as a combination of the first wiring 21 and the second wiring 22, it is desirable that the wirings contain the following elements. It is desirable that the first wiring 21 contain at least one element selected from the group consisting of tungsten, bismuth, rubidium, tantalum, molybdenum, rhodium, and tin and it is desirable that the second wiring contain at least one element selected from the group consisting of iridium, platinum, and palladium.

Since the second wiring 22 also causes a spin Hall effect, it is desirable to include a non-magnetic heavy metal. When both of the first wiring 21 and the second wiring 22 contain a heavy metal and the above combination is present, it is possible to create a large spin-orbit interaction while the first wiring 21 and the second wiring 22 satisfy a predetermined temperature dependency relation.

It is desirable that a thickness of the first wiring 21 be equal to or less than a spin diffusion length of an element constituting the first wiring 21. Since the thickness of the first wiring 21 is then sufficiently small, spins generated by the second wiring 22 can reach the first ferromagnetic layer 10.

The thickness of the first wiring 21 is preferably 0.25 times or more to 2.0 times or less a thickness of the second wiring 22, more preferably 0.5 times or more and 1.0 times or less the thickness of the second wiring 22.

When the thicknesses of the first wiring 21 and the second wiring 22 satisfy the above relation, a difference between the resistivity of the first wiring 21 and the second wiring 22 is not large. Furthermore, it is possible to reduce a current flowing through the spin-orbit torque wiring 20 and to reduce an installation area of the spin-orbit torque type magnetization rotating element and a size of a transistor.

Also, the spin-orbit torque wiring 20 may contain a magnetic metal. The magnetic metal refers to a ferromagnetic metal or an antiferromagnetic metal. When a trace amount of magnetic metal is contained in a non-magnetic metal, this becomes a cause of scattering of spins. When spins scatter, a spin-orbit interaction is enhanced and the spin current generation efficiency with respect to a current increases.

On the other hand, when an amount of magnetic metal to be added is excessively increased, the generated spin current is scattered by the added magnetic metal, and as a result, an action of decreasing the spin current becomes strong in some cases. For this reason, it is desirable that a molar ratio of a magnetic metal to be added be sufficiently smaller than a total molar ratio of elements constituting the spin-orbit torque wiring. The molar ratio of the magnetic metal to be added is preferably 3% or less of the total amount.

The spin-orbit torque wiring 20 may include a topological insulator. Although the topological insulator is made of a material in which the interior of the material is formed of an insulator or a high resistance body, the topological insulator is made of a substance in which a spin-polarized metal state is generated on its surface. An internal magnetic field is generated in this material due to the spin-orbit interaction. Thus, even when there is no external magnetic field, a new topological phase develops due to the effect of the spin-orbit interaction. This is a topological insulator and it is possible to generate a pure spin current with high efficiency by a strong spin orbital interaction and breaking of inversion symmetry at an edge.

Suitable examples of the topological insulator include $SnTe$, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. These topological insulators can generate a spin current with high efficiency.

(Function of Spin-Orbit Torque Type Magnetization Rotating Element)

The magnetic anisotropy energy of the first ferromagnetic layer 10 at a low temperature is larger than the magnetic anisotropy energy of the first ferromagnetic layer 10 at a high temperature. That is to say, the magnetization $M_{10}$ of the first ferromagnetic layer 10 is difficult to rotate at a low temperature and the magnetization $M_{10}$ of the first ferromagnetic layer 10 is easy to rotate at a high temperature. In order to rotate the magnetization $M_{10}$ of the first ferromagnetic layer 10, it is necessary to inject more spins from the spin-orbit torque wiring 20 in the case of low temperature than in the case of high temperature.

As illustrated in FIGS. 2A to 2C, the resistance values $R_{21}$ and $R_{22}$ of the first wiring 21 and the second wiring 22 at a low temperature (for example, −40° C.) are lower than the resistance values $R_{21}$ and $R_{22}$ of the first wiring 21 and the second wiring 22 at a reference temperature (for example, room temperature). For this reason, when connected to a constant voltage source, an amount of current flowing through the spin-orbit torque wiring 20 at a low temperature is larger than that in the case of reference temperature. When a current density of the current I flowing through the spin-orbit torque wiring 20 increases, many spins are injected into the first ferromagnetic layer 10.

Also, in the first wiring 21, the temperature dependency of the resistivity in the temperature range of at least −40 to 100° C. is larger than that of the second wiring 22. The current I flowing through the spin-orbit torque wiring 20 can be schematically regarded as being divided into the first wiring 21 and the second wiring 22. An amount of current shunted to the first wiring 21 increases as the temperature decreases.

The first wiring 21 is located closer to the first ferromagnetic layer 10 side than the second wiring 22. When an amount of current shunted to the first wiring 21 close to the first ferromagnetic layer 10 increases, more spins are efficiently injected into the first ferromagnetic layer 10.

On the other hand, the resistance values $R_{21}$ and $R_{22}$ of the first wiring 21 and the second wiring 22 at a high temperature (for example, 100° C.) are higher than the resistance values $R_{21}$ and $R_{22}$ of the first wiring 21 and the second wiring 22 at the reference temperature (for example, room temperature). For this reason, when connected to a constant voltage source, an amount of current flowing through the spin-orbit torque wiring 20 at a high temperature is lower than in the case of the reference temperature. An amount of current flowing through the spin-orbit torque wiring 20 decreases and an amount of spins to be injected into the first ferromagnetic layer 10 decreases. Since the magnetization stability of the first ferromagnetic layer 10 decreases at a high temperature, even when an amount of spins to be injected decreases, the magnetization $M_{10}$ of the first ferromagnetic layer 10 rotates.

Also, the resistance value $R_{22}$ of the second wiring 22 is hardly affected by a temperature change. As amount of current shunted to the second wiring 22 at a high temperature increases, an amount of current shunted to the first wiring 21 relatively decreases. When an amount of current shunted to the first wiring 21 close to the first ferromagnetic layer 10 decreases, an amount of spins to be injected into the first ferromagnetic layer 10 decreases.

In the spin-orbit torque wiring 20, a proportion between an amount of current shunted to the first wiring 21 and an amount of current shunted to the second wiring 22 automatically changes in accordance with a temperature. Even when a constant voltage is applied to the spin-orbit torque wiring 20, an amount of spins to be injected into the first ferromagnetic layer 10 changes in accordance with the stability of the magnetization $M_{10}$ of the first ferromagnetic layer 10.

As described above, in the spin-orbit torque type magnetization rotating element 100 according to this embodiment, an amount of spins to be injected into the first ferromagnetic layer 10 changes in accordance with a temperature. An amount of spins to be injected increases at a low temperature at which the stability of the magnetization $M_{10}$ of the first ferromagnetic layer 10 is high and an amount of spins to be injected decreases at a high temperature at which the stability of the magnetization $M_{10}$ of the first ferromagnetic layer 10 is low. Even when the spin-orbit torque wiring 20 is connected to a voltage source configured to apply a constant voltage, an operation is automatically secured in accordance with the stability of the magnetization $M_{10}$ of the first ferromagnetic layer 10. That is to say, the spin-orbit torque type magnetization rotating element 100 according to this embodiment can be used in a wide temperature range.

The spin-orbit torque type magnetization rotating element 100 according to this embodiment does not require a thermometer which measures an operating temperature, a control unit which controls a voltage to be applied, and the like. That is to say, a size of the spin-orbit torque type magnetization rotating element 100 according to this embodiment can be reduced.

Second Embodiment

Figure 3:
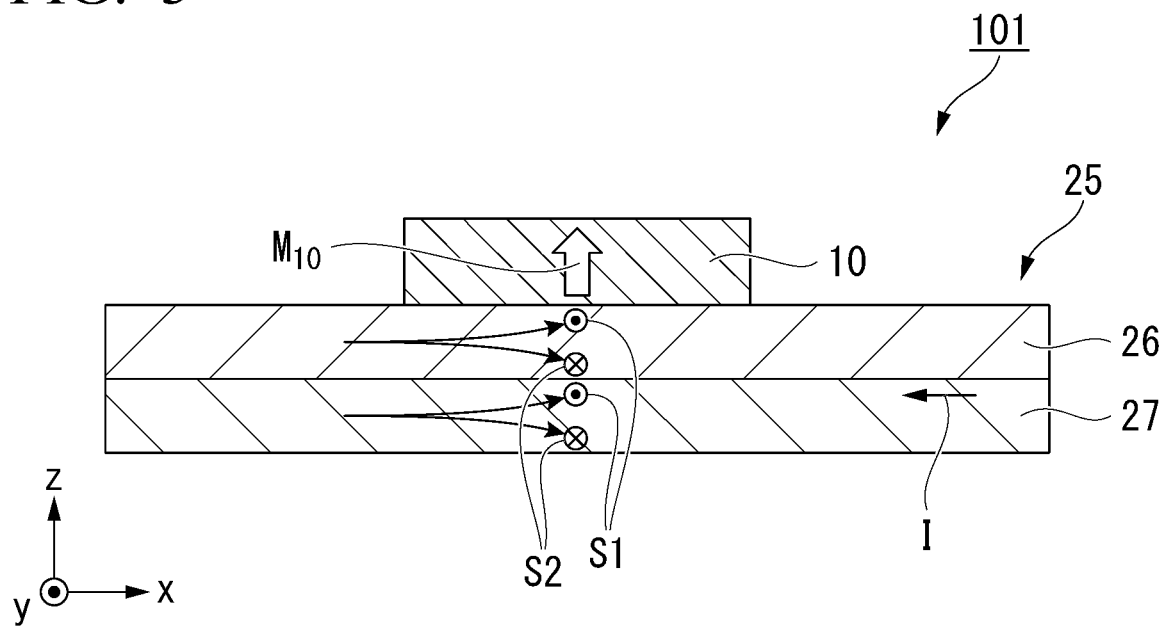
FIG. 3 is a schematic cross-sectional view of a spin-orbit torque type magnetization rotating element according to a second embodiment.

FIG. 3 is a schematic cross-sectional view of a spin-orbit torque type magnetization rotating element 101 according to a second embodiment. The spin-orbit torque type magnetization rotating element 101 illustrated in FIG. 3 includes a first ferromagnetic layer 10 and a spin-orbit torque wiring 25. The spin-orbit torque wiring 25 includes a first wiring 26 and a second wiring 27. The spin-orbit torque type magnetization rotating element 101 illustrated in FIG. 3 and the spin-orbit torque type magnetization rotating element 100 illustrated in FIG. 1 differ in that, in the spin-orbit torque type magnetization rotating element 101 illustrated in FIG. 3, a material constituting the second wiring 27 is a semiconductor. Description of a constitution that is the same as that of the spin-orbit torque type magnetization rotating element 100 illustrated in FIG. 1 will be omitted.

The first wiring 26 is made of a metal and the second wiring 27 is made of a semiconductor. Here, the expression "made of a metal" refers to indicating a metallic behavior with respect to a temperature and the expression "made of a semiconductor" refers to indicating a semiconductive behavior with respect to a temperature. The semiconductive behavior refers to a behavior in which a resistance decreases as a temperature increases. Since a behavior of a resistance value with respect to a temperature change is different between the first wiring 26 and the second wiring 27, the temperature dependency of the resistance value is not limited.

Figure 4A:
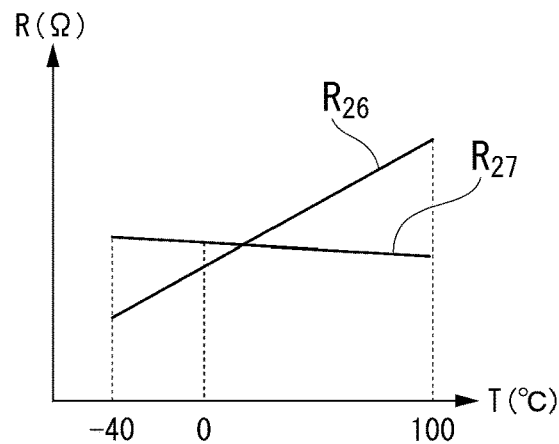
FIG. 4A is a diagram schematically illustrating an example of the temperature dependency of the resistivity of a first wiring and a second wiring in a spin-orbit torque type magnetization rotating element according to the second embodiment.
Figure 4B:
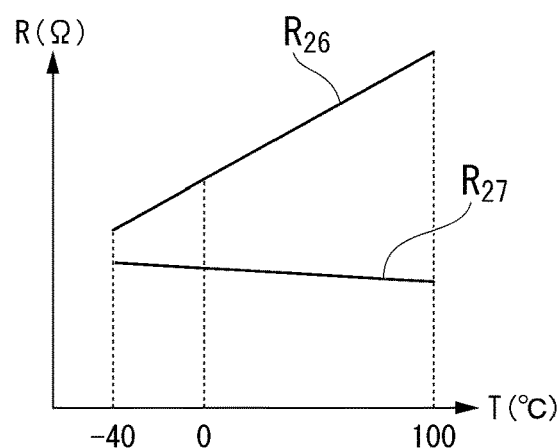
FIG. 4B is a diagram schematically illustrating an example of the temperature dependency of the resistivity of the first wiring and the second wiring in the spin-orbit torque type magnetization rotating element according to the second embodiment.
Figure 4C:
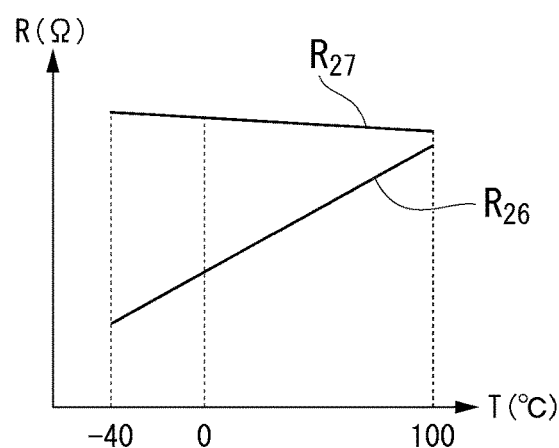
FIG. 4C is a diagram schematically illustrating an example of the temperature dependency of the resistivity of the first wiring and the second wiring in the spin-orbit torque type magnetization rotating element according to the second embodiment.

FIGS. 4A to 4C are diagrams schematically illustrating the temperature dependency of the resistivity of the first wiring 26 and the second wiring 27. A resistance value $R_{26}$ of the first wiring 26 and a resistance value $R_{27}$ of the second wiring 27 may have any of the relationships in FIGS. 4A to 4C therebetween. FIG. 4A is a diagram illustrating a case in which the resistance value $R_{26}$ of the first wiring 26 and the resistance value $R_{27}$ of the second wiring 27 are reversed using either one of the temperatures as an intersection point. FIG. 4B is a diagram a case in which the resistance value $R_{26}$ of the first wiring 26 is larger than the resistance value $R_{27}$ of the second wiring 27 within the temperature range of −40 to 100° C. FIG. 4C is a diagram in a case in which the resistance value $R_{26}$ of the first wiring 26 is smaller than the resistance value $R_{27}$ of the second wiring 27 within the temperature range of −40 to 100° C. Since the second wiring 27 made of a semiconductor has a normal resistance value higher than that of the first wiring 26 made of a metal, the second wiring 27 and the first wiring 26 have the relation of FIG. 4C in many cases.

As illustrated in FIGS. 4A to 4C, the resistance value of the first wiring 26 increases from a low temperature (for example, −40° C.) toward a high temperature (for example, 100° C.). On the other hand, the resistance value of the second wiring 27 decreases from a low temperature (for example, −40° C.) toward a high temperature (for example, 100° C.). For this reason, an amount of current shunted to the first wiring 26 increases as a temperature decreases and an amount of current shunted to the second wiring 27 increases as the temperature increases.

In the spin-orbit torque wiring 25, a ratio between an amount of current shunted to the first wiring 26 and an amount of current shunted to the second wiring 27 automatically changes in accordance with a temperature. Even when a constant voltage is applied to the spin-orbit torque wiring 25, an amount of spins to be injected into the first ferromagnetic layer 10 changes in accordance with the stability of the magnetization $M_{10}$ of the first ferromagnetic layer 10.

As described above, in the spin-orbit torque type magnetization rotating element 101 according to this embodiment, an amount of spins to be injected into the first ferromagnetic layer 10 changes in accordance with a temperature. An amount of spins to be injected increases at a low temperature at which the stability of the magnetization $M_{10}$ of the first ferromagnetic layer 10 is high and an amount of spins to be injected decreases at a high temperature at which the stability of the magnetization $M_{10}$ of the first ferromagnetic layer 10 is low. Even when the spin-orbit torque wiring 25 is connected to a voltage source which applies a constant voltage, an operation is automatically secured in accordance with the stability of the magnetization $M_{10}$ of the first ferromagnetic layer 10. That is to say, the spin-orbit torque type magnetization rotating element 101 according to this embodiment can be used in a wide temperature range.

The spin-orbit torque type magnetization rotating element 101 according to this embodiment does not require a thermometer which measures an operating temperature, a control unit which controls a voltage to be applied, and the like. That is to say, a size of the spin-orbit torque type magnetization rotating element 101 according to this embodiment can be reduced.

The spin current magnetization rotating element according to the first embodiment and the second embodiment can be applied to a magnetoresistance effect element which will be described later. However, the application is not limited to the magnetoresistance effect element, and can be applied to other uses. As other applications, the present disclosure can also be used, for example, in a spatial light modulator which spatially modulates incident light using a magneto-optical effect by disposing the spin current magnetization rotating element in each pixel. In addition, in order to prevent the effect of hysteresis due to the coercivity of a magnet in a magnetic sensor, a magnetic field applied to a magnetization easy axis of the magnet may be replaced by an SOT.

The spin current magnetization rotating element can be particularly referred to as a spin current magnetization rotational element when the magnetization thereof is reversed.

Modified Example

It should be noted that the spin-orbit torque type magnetization rotating element according to this embodiment is not limited to the above.

The first wirings 21 and 26 may be made of a metal and the second wirings 22 and 27 may be made of a topological insulator.

The first wirings 21 and 26 may be made of a semiconductor and the second wirings 22 and 27 may be made of a topological insulator.

Third Embodiment

<Spin-Orbit Torque Type Magnetoresistance Effect Element>

Figure 5:
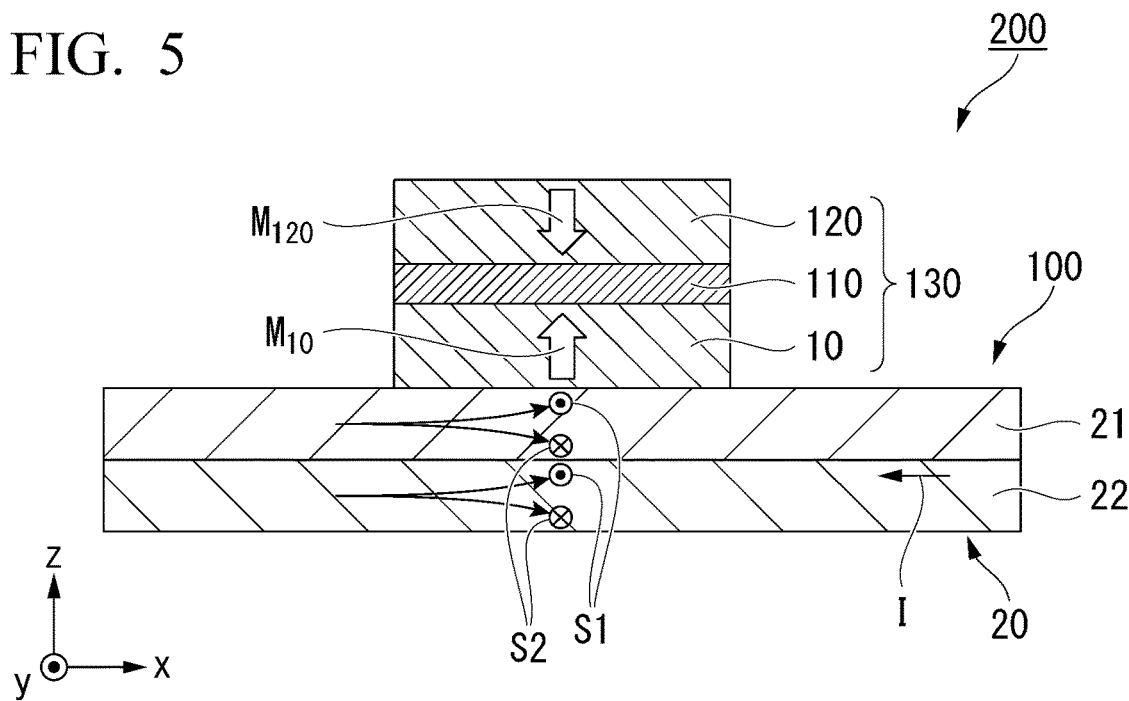
FIG. 5 is a schematic cross-sectional view of a spin-orbit torque type magnetoresistance effect element according to a third embodiment.

FIG. 5 is a schematic cross-sectional view of a spin-orbit torque type magnetoresistance effect element 200 according to a third embodiment. The spin-orbit torque type magnetoresistance effect element 200 illustrated in FIG. 5 includes a spin-orbit torque type magnetization rotating element 100, a non-magnetic layer 110, and a second ferromagnetic layer 120. In FIG. 5, the spin-orbit torque type magnetization rotating element 100 according to the first embodiment is used as the spin-orbit torque type magnetization rotating element, but the spin-orbit torque type magnetization rotating element 101 according to the second embodiment may be used. A description of a constitution that is the same as that of the spin-orbit torque type magnetization rotating element 100 in the first embodiment will be omitted.

A laminate (a functional unit 130) obtained by laminating a first ferromagnetic layer 10, the non-magnetic layer 110, and the second ferromagnetic layer 120 functions in the same manner as a normal magnetoresistance effect element. The functional unit 130 functions when the magnetization $M_{120}$ of the second ferromagnetic layer 120 is fixed in one direction (for example, the −z direction) and a direction of the magnetization $M_{10}$ of the first ferromagnetic layer 10 relatively changes. When applied to a coercivity-differed type (a pseudo spin valve type) MRAM, the coercivity of the second ferromagnetic layer 120 is made larger than the coercivity of the first ferromagnetic layer 10. When applied to an exchange bias type (a spin valve type) MRAM, the magnetization $M_{120}$ of the second ferromagnetic layer 120 is fixed by exchange joining with an antiferromagnetic layer.

Also, in the functional unit 130, the functional unit 130 has a constitution that is the same as that of a tunneling magnetoresistance (TMR) element when the non-magnetic layer 110 is made of an insulator and has a constitution that is the same as that of a giant magnetoresistance (GMR) element when the non-magnetic layer 110 is made of a metal.

A known lamination constitution of the magnetoresistance effect element can be adopted as a lamination constitution of the functional unit 130. For example, each layer may be constituted of a plurality of layers or may include another layer such as an antiferromagnetic layer for fixing a magnetization direction of the second ferromagnetic layer 120. The second ferromagnetic layer 120 is referred to as a fixed layer or a reference layer and the first ferromagnetic layer 10 is referred to as a free layer, a storage layer, or the like.

A known material can be used for a material of the second ferromagnetic layer 120. For example, a metal selected from the group consisting of Cr, Mn, Co, Fe, and Ni and an alloy which contains at least one of these metals and exhibits a ferromagnetism can be used. It is also possible to use an alloy which contains at least one of these metals and at least one of B, C, and N. To be specific, Co—Fe and Co—Fe—B may be exemplified. Furthermore, a Heusler alloy such as $Co_2FeSi$ may be used for the second ferromagnetic layer 120.

In order to further increase the coercivity of the second ferromagnetic layer 120 with respect to the first ferromagnetic layer 10, an antiferromagnetic material such as IrMn and PtMn may be used as a material in contact with the second ferromagnetic layer 120. In addition, in order to prevent a leakage magnetic field of the second ferromagnetic layer 120 from affecting the first ferromagnetic layer 10, a structure of synthetic ferromagnetic coupling may be provided.

A known material can be used for the non-magnetic layer 110.

For example, when the non-magnetic layer 110 is made of an insulator (when the non-magnetic layer 110 is a tunnel barrier layer), as a material thereof, $Al_2O_3$, $SiO_2$, MgO, $MgAl_2O_4$, and the like can be used. Furthermore, in addition to these, materials in which some of Al, Si, and Mg is substituted with Zn, Be, or the like can also be used. Among these, MgO and $MgAl_2O_4$ are materials capable of realizing coherent tunneling. When the non-magnetic layer 110 is made of a metal, Cu, Au, Ag, and the like can be used as a material thereof. In addition, when the non-magnetic layer 110 is made of a semiconductor, Si, Ge, $CuInSe_2$, $CuGaSe_2$, $Cu(In, Ga)Se_2$, and the like can be used as a material thereof.

The functional unit 130 may include other layers. For example, a cap layer may be provided on a surface of the second ferromagnetic layer 120 opposite to the non-magnetic layer 110.

The spin-orbit torque type magnetoresistance effect element 200 according to the third embodiment can record and read data using a change in resistance value of the functional unit 130 caused by a difference in relative angle between the magnetization Mm of the first ferromagnetic layer 10 and the magnetization $M_{120}$ of the second ferromagnetic layer 120. Furthermore, since the spin-orbit torque type magnetoresistance effect element 200 according to the third embodiment includes the spin-orbit torque type magnetization rotating element 100, the spin-orbit torque type magnetoresistance effect element 200 can be used in a wide temperature range. In addition, since the spin-orbit torque type magnetoresistance effect element 200 according to the third embodiment includes the spin-orbit torque type magnetization rotating element 100, a size of the spin-orbit torque type magnetoresistance effect element 200 can be reduced.

Fourth Embodiment

<Magnetic Memory>

Figure 6:
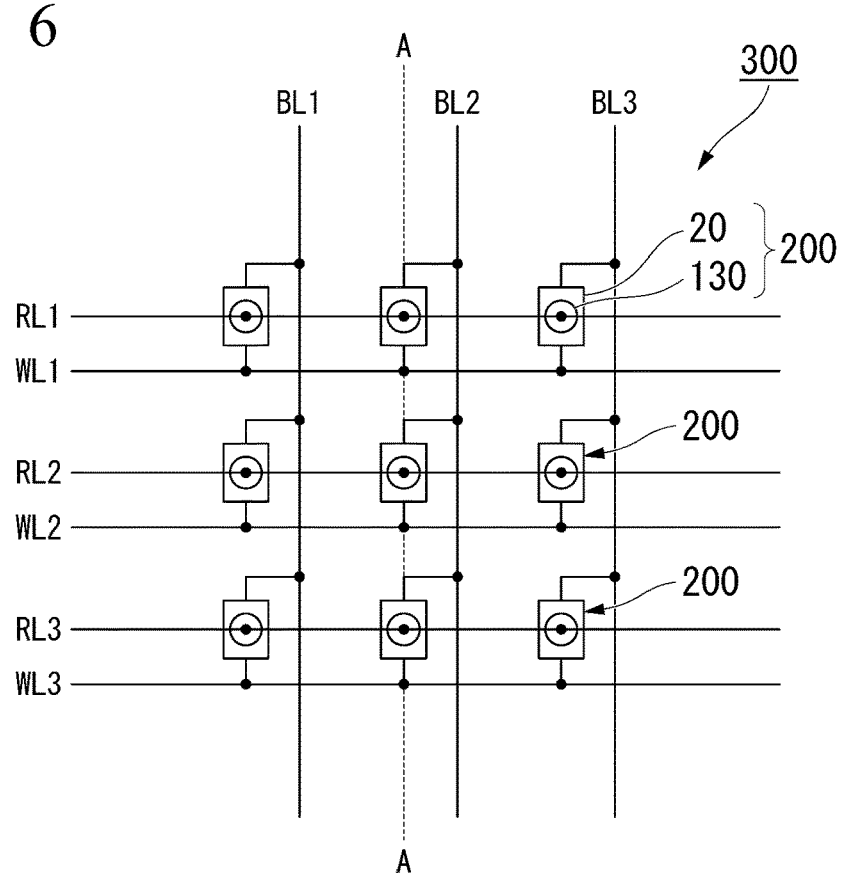
FIG. 6 is a diagram schematically illustrating a magnetic memory according to a fourth embodiment.

FIG. 6 is a plan view of a magnetic memory 300 which includes a plurality of spin-orbit torque type magnetoresistance effect elements 200 (refer to FIG. 5). FIG. 5 corresponds to a cross-sectional view of the spin-orbit torque type magnetoresistance effect element 200 taken along surface A-A in FIG. 6. In the magnetic memory 300 illustrated in FIG. 6, the spin-orbit torque type magnetoresistance effect element 200 has a 3×3 matrix arrangement.

FIG. 6 is an example of a magnetic memory and the number and arrangement of spin-orbit torque type magnetoresistance effect elements 200 are arbitrary.

One of word lines WL1 to WL3, one of bit lines BL1 to BL3, and one of read lines RL1 to RL3 are connected to the spin-orbit torque type magnetoresistance effect element 200.

By selecting the word lines WL1 to WL3 and the bit lines BL1 to BL3 to which a current is applied, a current is caused to flow through the spin-orbit torque wiring 20 of an arbitrary spin-orbit torque type magnetoresistance effect element 200 and thus a write operation is performed. Furthermore, by selecting the read lines RL1 to RL3 and the bit lines BL1 to BL3 to which a current is applied, a current is caused to flow in a lamination direction of an arbitrary spin-orbit torque type magnetoresistance effect element 200 and thus a read operation is performed. The word lines WL1 to WL3, the bit lines BL1 to BL3, and the read lines RL1 to RL3 to which a current is applied can be selected by a transistor or the like. That is to say, by reading data of an arbitrary element from the plurality of spin-orbit torque type magnetoresistance effect elements 200, the plurality of spin-orbit torque type magnetoresistance effect elements 200 can be used as a magnetic memory.

While the preferred embodiments of the present disclosure have been described in detail above, the present disclosure is not limited to the specific embodiments and various modifications and changes thereof are possible without departing from the gist of the present disclosure within the scope of the claims.

REFERENCE SIGNS LIST

10 First ferromagnetic layer
20, 25 Spin-orbit torque wiring
21, 26 First wiring
22, 27 Second wiring
100, 101 Spin-orbit torque type magnetization rotating element
110 Non-magnetic layer
120 Second ferromagnetic layer
130 Functional unit
200 Spin-orbit torque type magnetoresistance effect element
300 Magnetic memory
$M_{10}$, $M_{120}$ Magnetization

The invention claimed is:

1. A spin-orbit torque type magnetization rotating element, comprising:
    a spin-orbit torque wiring extending in a first direction; and
    a first ferromagnetic layer laminated on one surface of the spin-orbit torque wiring such that a first side of the first ferromagnetic layer faces the one surface of the spin-orbit torque wiring, wherein:
    the spin-orbit torque wiring includes a first wiring and a second wiring in an order from the first side of the first ferromagnetic layer; and
    the first wiring is made of a metal and the second wiring is made of a semiconductor.

2. A spin-orbit torque type magnetization rotating element, comprising:
    a spin-orbit torque wiring extending in a first direction; and
    a first ferromagnetic layer laminated on one surface of the spin-orbit torque wiring such that a first side of the first ferromagnetic layer faces the one surface of the spin-orbit torque wiring, wherein:
    the spin-orbit torque wiring includes a first wiring and a second wiring in an order from the first side of the first ferromagnetic layer; and
    the first wiring is made of a semiconductor and the second wiring is made of a topological insulator.

3. The spin-orbit torque type magnetization rotating element according to claim 1, wherein the first wiring includes a non-magnetic metal having a large atomic number with an atomic number of 39 or more having d electrons or f electrons in the outermost shell.

4. The spin-orbit torque type magnetization rotating element according to claim 1, wherein a thickness of the first wiring is equal to or less than a spin diffusion length of an element constituting the first wiring.

5. A spin-orbit torque type magnetoresistance effect element, comprising:
    the spin-orbit torque type magnetization rotating element according to claim 1;
    a second ferromagnetic layer that is provided on a side of the first ferromagnetic layer opposite to the first side; and
    a non-magnetic layer located between the first ferromagnetic layer and the second ferromagnetic layer.

6. A magnetic memory, comprising:
    a plurality of the spin-orbit torque type magnetoresistance effect elements according to claim 5.

7. The spin-orbit torque type magnetization rotating element according to claim 2, wherein a thickness of the first wiring is equal to or less than a spin diffusion length of an element constituting the first wiring.

8. The spin-orbit torque type magnetization rotating element according to claim 3, wherein a thickness of the first wiring is equal to or less than a spin diffusion length of an element constituting the first wiring.

9. A spin-orbit torque type magnetoresistance effect element, comprising:
    the spin-orbit torque type magnetization rotating element according to claim 2;
    a second ferromagnetic layer that is provided on a side of the first ferromagnetic layer opposite to the first side; and
    a non-magnetic layer located between the first ferromagnetic layer and the second ferromagnetic layer.

10. A spin-orbit torque type magnetoresistance effect element, comprising:
    the spin-orbit torque type magnetization rotating element according to claim 3;
    a second ferromagnetic layer that is provided on a side of the first ferromagnetic layer opposite to the first side; and
    a non-magnetic layer located between the first ferromagnetic layer and the second ferromagnetic layer.

11. A spin-orbit torque type magnetoresistance effect element, comprising:
    the spin-orbit torque type magnetization rotating element according to claim 4;
    a second ferromagnetic layer that is provided on a side of the first ferromagnetic layer opposite to the first side; and
    a non-magnetic layer located between the first ferromagnetic layer and the second ferromagnetic layer.

12. A spin-orbit torque type magnetoresistance effect element, comprising:
    the spin-orbit torque type magnetization rotating element according to claim 7;
    a second ferromagnetic layer that is provided on a side of the first ferromagnetic layer opposite to the first side; and
    a non-magnetic layer located between the first ferromagnetic layer and the second ferromagnetic layer.

13. A spin-orbit torque type magnetoresistance effect element, comprising:
    the spin-orbit torque type magnetization rotating element according to claim 8;
    a second ferromagnetic layer that is provided on a side of the first ferromagnetic layer opposite to the first side; and
    a non-magnetic layer located between the first ferromagnetic layer and the second ferromagnetic layer.

14. A magnetic memory, comprising:
    a plurality of the spin-orbit torque type magnetoresistance effect elements according to claim 9.

15. A magnetic memory, comprising:
    a plurality of the spin-orbit torque type magnetoresistance effect elements according to claim 10.

16. A magnetic memory, comprising:
    a plurality of the spin-orbit torque type magnetoresistance effect elements according to claim 11.

17. A magnetic memory, comprising:
    a plurality of the spin-orbit torque type magnetoresistance effect elements according to claim 12.

18. A magnetic memory, comprising:
a plurality of the spin-orbit torque type magnetoresistance effect elements according to claim 13.

\* \* \* \* \*